US 11,788,899 B2

(12) United States Patent
Fulcher et al.

(10) Patent No.: US 11,788,899 B2
(45) Date of Patent: Oct. 17, 2023

(54) APPARATUS AND METHOD FOR DETECTION CURRENT IMBALANCE

(71) Applicant: Airbus SAS, Blagnac (FR)

(72) Inventors: Thomas Fulcher, Bristol (GB); Boris Schwerdt, Bristol (GB)

(73) Assignee: AIRBUS (SAS), Blagnac (FR)

( * ) Notice: Subject to any disclaimer, the term of this patent is extended or adjusted under 35 U.S.C. 154(b) by 20 days.

(21) Appl. No.: 17/705,001

(22) Filed: Mar. 25, 2022

(65) Prior Publication Data
US 2022/0307910 A1 Sep. 29, 2022

(30) Foreign Application Priority Data

Mar. 26, 2021 (GB) ..................................... 2104331

(51) Int. Cl.
*G01K 3/14* (2006.01)
*G01K 1/02* (2021.01)
(Continued)

(52) U.S. Cl.
CPC ............... *G01K 3/14* (2013.01); *G01K 1/026* (2013.01); *G01K 11/32* (2013.01); *H02H 1/0007* (2013.01); *H02H 7/22* (2013.01)

(58) Field of Classification Search
CPC .......... G01K 3/14; G01K 1/026; G01K 11/32; G01K 11/3206; H02H 1/0007; H02H 7/22;
(Continued)

(56) References Cited

U.S. PATENT DOCUMENTS 6,811,307 B2 5/2004 Crowe et al.
11,467,043 B2 * 10/2022 Valentin ................. G01K 11/32
(Continued)

FOREIGN PATENT DOCUMENTS

CA 2 312 723 6/1999
CN 201122456 9/2008
(Continued)

OTHER PUBLICATIONS

[Online]—Bandweaver, "Distributed Temperature Sensor", Power Cable Monitoring—Fiber Optic Sensing Applications, https://www.bandweaver.com/, printed on Sep. 4, 2021, 5 pages.
(Continued)

*Primary Examiner* — Jared Fureman
*Assistant Examiner* — Nicolas Bellido
(74) *Attorney, Agent, or Firm* — Nixon & Vanderhye P.C.

(57) ABSTRACT

An apparatus and method for detecting current imbalance between two or more electrical energy distribution elements of an electrical energy distribution network are disclosed. Each of a plurality of temperature sensors are implemented by a temperature sensing section of an optical fiber arranged to produce, in response to an optical input signal, an optical output signal indicative of the temperature of the temperature sensing section. First and second temperature sensors of the plurality are in thermal contact with first and second electrical energy distribution elements, respectively, to determine first and second temperature characteristics thereof based on the respective output signals. A current imbalance between the first and second elements is detected based on a comparison of the first temperature characteristic with the second temperature characteristic.

25 Claims, 4 Drawing Sheets

(51) Int. Cl.
*G01K 11/32* (2021.01)
*H02H 1/00* (2006.01)
*H02H 7/22* (2006.01)

(58) Field of Classification Search
CPC ... H02H 3/32; H02H 5/04; H02H 3/28; G01R 29/16; B64D 47/00; B64D 2221/00
See application file for complete search history.

(56) References Cited

U.S. PATENT DOCUMENTS

| | | | |
|---|---|---|---|
| 2002/0125414 | A1 | 9/2002 | Dammann |
| 2013/0258529 | A1 | 10/2013 | Carroll |
| 2014/0266742 | A1 | 9/2014 | Rennie |
| 2014/0346986 | A1* | 11/2014 | Warr .................. H02J 3/06 318/400.21 |
| 2017/0138802 | A1* | 5/2017 | Fisk .................. G01K 13/00 |
| 2019/0250048 | A1* | 8/2019 | Valentin ............ G01K 11/3206 |

FOREIGN PATENT DOCUMENTS

| | | |
|---|---|---|
| CN | 202003069 | 10/2011 |
| CN | 105116285 | 12/2015 |
| CN | 107976641 | 5/2018 |
| CN | 113395347 A * | 9/2021 |
| GB | 2570940 | 8/2019 |
| JP | H0622441 | 1/1994 |
| JP | 2020085508 | 6/2020 |
| WO | 2015/199590 | 12/2015 |

OTHER PUBLICATIONS

Yokogawa HSE (Health, Safety and Environment) Solution, "Power Cable Monitoring for Overheating", 2015, 2 pages.
"Detecting Electrical Unbalance and Overloads", Applications for Thermal Imagers, www.fluke.com/thermography, Nov. 3, 2017, 2 pages.
European Search Report cited in EP 22164553.4, dated Sep. 6, 2022, 6 pages.

* cited by examiner

APPARATUS AND METHOD FOR DETECTION CURRENT IMBALANCE

RELATED APPLICATION

This application incorporates by reference and claims priority to United Kingdom patent application GB 2104331.0, filed Mar. 26, 2021.

TECHNICAL FIELD

The present invention relates to a detecting current imbalance, and more particularly to an apparatus and method for detecting current imbalance between two or more electrical energy distribution elements of an electric energy distribution network.

BACKGROUND

An electrical energy distribution network delivers electrical energy from an electrical energy source, such as a battery or a generator, to an electrical energy consumer, such as an electric motor. This is achieved using one or more electrical energy distribution elements, such as electrical energy distribution cables. These cables carry electrical current. The cables are rated to carry up to a certain current, beyond which the use of the cable may not be safe.

Electrical energy distribution networks can utilise more than one cable to carry electric current from a source to a consumer. In such cases, the network may be arranged such that, under normal operating conditions, the current is balanced between the cables. That is, the current carried by each cable is the same, within a certain tolerance. However, in some situations, for example due to a fault, there may be a current imbalance between the cables. That is, the current carried by each cable may not be the same, for example differ by an amount larger than a certain tolerance. In such cases, current imbalance is undesirable. For example, it can cause one or more cables to carry current higher than their rating, which presents a safety issue. As another example, it can damage the source and/or consumer of the electrical energy provided by the electrical energy distribution network. It is therefore desirable to detect current imbalance.

Current imbalance can be detected by measuring the current carried by each cable using a current sensor such as a current transformer. Each cable is passed through a current transformer and the current in each cable measured by measuring the current induced in the current transformer. However, current sensors have drawbacks. Current sensors such as current transformers have a relatively large size and weight. This is exacerbated in high voltage and/or high current electrical energy distribution networks, for which the current transformers need to be accordingly large in order to sense the current. Moreover, in order for the current carried by one cable not to interfere with the measurement of the current carried by another cable, the current sensors need to be relatively well spaced apart, which takes up space. Moreover, since each cable needs to be passed through a respective current transformer, where cables are bundled the bundle needs to be separated out in order for the current to be measured, which takes up space.

It is desirable to reduce the weight of and space taken up by current imbalance detection. For example, reduction of size and weight of components can be of particular importance in vehicles such as aircraft. In particular, for aircraft such as passenger aircraft for which propulsion is provided at least in part by an electric motor, a high voltage and/or current electrical energy distribution network may be required to supply electrical energy to the electric motor. In these cases, it may be difficult or not possible to integrate current sensors such as current transformers in a way that complies with the weight and/or space limitations imposed by the design of the aircraft.

It is an object of the present invention to mitigate at least some of the drawbacks of the prior art.

SUMMARY

According to a first aspect of the present invention, there is provided apparatus configured to detect current imbalance between two or more electrical energy distribution elements of an electrical energy distribution network in use, the apparatus comprising: a plurality of temperature sensors, each temperature sensor being implemented by a temperature sensing section of an optical fiber, each temperature sensing section being arranged to produce, in response to an optical input signal, an optical output signal indicative of the temperature of the temperature sensing section, wherein one or more first temperature sensors of the plurality of temperature sensors are configured for thermal contact with a first electrical energy distribution element of the electrical energy distribution network; and one or more second temperature sensors of the plurality of temperature sensors are configured for thermal contact with a second, different, electrical energy distribution element of the electrical energy distribution network; and a detecting unit configured to: determine a first temperature characteristic of the first electrical energy distribution element based on one or more of the optical output signals of the one or more first temperature sensors in use; determine a second temperature characteristic of the second electrical energy distribution element based on one or more of the optical output signals of the one or more second temperature sensors in use; compare the first temperature characteristic with the second temperature characteristic; and detect a current imbalance between the first electrical energy distribution element and the second electrical energy distribution element based on the comparison of the first temperature characteristic with the second temperature characteristic.

Optionally, each electrical energy distribution element is an electrical energy distribution cable.

Optionally, the detecting unit is configured to detect the current imbalance based on a determination that a difference between the first temperature characteristic and the second temperature characteristics is greater than a threshold value.

Optionally, the detecting unit is configured to infer, based on the first temperature characteristic and the second characteristic, which of the electrical energy distribution elements is associated with a fault causing the detected current imbalance.

Optionally, the apparatus comprises a plurality of optical fiber, wherein the one or more first temperature sensors are implemented by said temperature sensing sections of a first optical fiber, and the one or more second temperature sensors are implemented by said temperature sensing sections of a second, different, optical fiber.

Optionally, there are a plurality of the first temperature sensors configured for thermal contact at respective different points along a length of the first electrical energy distribution element, and there are a plurality of the second temperature sensors configured for thermal contact at respective different points along a length of the second electrical energy distribution element.

Optionally, the detecting unit comprises an optical interrogator configured to: provide the optical input signal to each of the temperature sensing sections; receive the optical output signal from each of the temperature sensing sections.

Optionally, a third temperature sensor of the plurality is configured for thermal contact with a third electrical energy distribution element of the electrical energy distribution network, and the detecting unit is configured to: determine a third temperature characteristic of the third electrical energy distribution element based on one or more of the optical output signals of the third temperature sensor in use; and detect a current imbalance between two or more of the first, second and third electrical energy distribution elements based on a comparison of the first, second and third temperature characteristics.

Optionally, the detecting unit is configured to: in response to detecting a current imbalance, trigger a mitigation action for the current imbalance.

According to a second aspect of the present invention, there is provided a system comprising the apparatus according to the first aspect, and the electrical energy distribution network.

Optionally, the electrical energy distribution network is configured such that a given current carried by the electrical energy distribution network between an electrical energy source and an electrical energy consumer is shared across the two or more electrical energy distribution elements.

Optionally, the electrical energy distribution network is configured such that each of the two or more electrical energy distribution elements carries alternating current of the same phase between an electrical energy source and an electrical energy consumer.

Optionally, each of the two or more electrical energy distribution elements are cables provided together as a bundled cable.

Optionally, the optical fiber or optical fiber by which the temperature sensing sections are provided are embedded in the bundled cable.

Optionally, the electrical energy distribution network comprises an electrical energy source and the detecting unit is configured to: responsive to a current imbalance being detected, transmit a control signal to the electrical energy source to reduce a current carried by the electrical energy distribution elements; and/or the electrical energy distribution network comprises a fuse common to each of the two or more electrical energy distribution elements, and wherein the detecting unit is configured to: responsive to a current imbalance being detected, transmit a control signal to the fuse to cause the fuse to break the electrical connection provided by each of the electrical energy distribution elements.

Optionally, the electrical energy distribution network is configured such that each of the two or more electrical energy distribution elements carries alternating current of a respective different phase from a multiphase electrical energy source to a multiphase electrical energy consumer.

Optionally, the detecting unit is configured to: responsive to a current imbalance being detected, transmit a control signal to the multiphase electrical energy source to alter an operating condition of the multiphase electrical energy power source.

Optionally, the first and second electrical energy distribution elements are configured to carry alternating current of a first phase from a multiphase source to a multiphase consumer, and wherein the third electrical energy distribution element is configured to carry alternating current of a second, different, phase from the multiphase source to the multiphase consumer, and wherein the detecting unit is configured to: based on a comparison of the first and second temperature characteristics, detect a first current imbalance within the first phase; and based on a comparison of the first and/or second temperature characteristics with the third temperature characteristic, detect a second current imbalance between the first and second phases.

Optionally, the detecting unit is configured to: responsive to a determination that the determined temperature characteristic of a given electrical energy distribution element is higher than a given temperature limit, transmit a control signal to a fuse associated with the given electrical energy distribution element to cause the fuse to break the electrical connection provided by the given electrical energy distribution element.

Optionally, the electrical energy distribution network is a vehicle's electrical energy distribution network.

Optionally, an electrical energy consumer to which the electrical energy distribution network is configured to provide electrical energy is a vehicle electrical propulsion motor.

According to a third aspect of the present invention, there is provided a vehicle comprising the apparatus according to the first aspect, or the system according to the second aspect.

Optionally the vehicle is an aircraft.

Optionally, the temperature sensors are located in a wing portion of the aircraft.

Optionally, the temperature sensors are located in a pylon of the wing portion.

According to the fourth aspect of the present invention, there is provided a method of detecting current imbalance between two or more electrical energy distribution elements of an electrical energy distribution network, the method comprising: sending an optical input signal to each of a plurality of temperature sensors, each temperature sensor being implemented by a temperature sensing section of an optical fiber, each temperature sensing section being arranged to produce, in response to the optical input signal, an optical output signal indicative of the temperature of the temperature sensing section, wherein one or more first temperature sensors of the plurality of temperature sensors in thermal contact with a first electrical energy distribution element of the electrical energy distribution network; and one or more second temperature sensors of the plurality of temperature sensors are in thermal contact with a second, different, electrical energy distribution element of the electrical energy distribution network; determining a first temperature characteristic of the first electrical energy distribution element based on one or more of the optical output signals of the one or more first temperature sensors; determining a second temperature characteristic of the second electrical energy distribution element based on one or more of the optical output signals of the one or more second temperature sensors; comparing the first temperature characteristic with the second temperature characteristic; and detecting a current imbalance between the first electrical energy distribution element and the second electrical energy distribution element based on the comparison of the first temperature characteristic with the second temperature characteristic.

Further features and advantages of the invention will become apparent from the following description of preferred embodiments of the invention, given by way of example only, which is made with reference to the accompanying drawings. As used herein, like reference signs denote like features.

DETAILED DESCRIPTION

Figure 1:
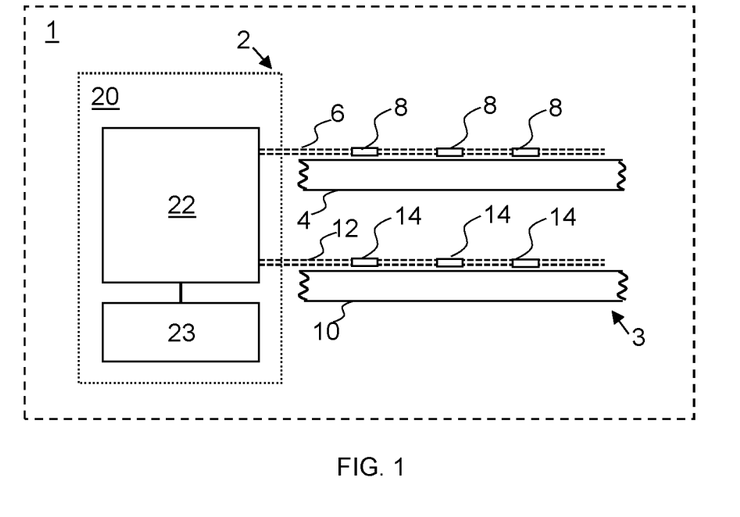
FIG. 1 is a schematic diagram that illustrates an apparatus, according to an example of the invention.

Referring to FIG. 1, there is illustrated a system 1 comprising an apparatus 2 and an electrical energy distribution network 3, according to an example.

As illustrated in FIG. 1, the electrical energy distribution network 3 comprises two electrical energy distribution elements 4, 10. For example, the electrical energy distribution network 3 may be configured to deliver electrical energy from an electrical energy source (not shown in FIG. 1) to an electrical energy consumer (not shown in FIG. 1) by means of the electrical energy distribution elements 4, 10. The electrical energy source may be, for example, a battery, generator, fuel cell (e.g. producing electrical energy from a chemical reaction), photovoltaic cell, or any other electrical energy source that provides electrical energy to the electrical energy distribution network 3. The electrical energy consumer may be, for example, an electrical motor or any other electrical energy consumer that consumes electrical energy from the electrical energy distribution network 3. Each electrical energy distribution element 4, 10 may be, for example, an electrical energy distribution cable or busbar or any other element that distributes electrical energy, for example by transporting electrons. Each element 4, 10 may be made from a single material such as aluminium or copper and/or a combination of different materials such as copper and aluminium, for example including a COPALUM connection. Although in the examples described hereinafter, the specific example of electrical energy distribution cables 4, 10 is referred to, it will be appreciated that any other electrical energy distribution elements 4, 10 that distribute electrical energy, for example by transporting electrons, may be used. Moreover, hereinafter, for the sake of brevity, the electrical energy distribution network 3 will be referred to simply as a 'network', an electrical energy source will be referred to as a 'source', an electrical energy consumer will be referred to as a 'consumer', and electrical energy distribution cables will be refereed to simply as 'cables'.

The apparatus 2 is configured to detect current imbalance between the cables 4, 10 of the network 3 in use. In broad overview, the apparatus 2 comprises a plurality of temperature sensors 8, 14 and a detection unit 20. A first set of temperature sensors 8 are in thermal contact with the first cable 4, and a second set of temperature sensors 14 are in thermal contact with the second cable 10. Each temperature sensor 8, 14 is implemented by a temperature sensing section 8, 14 of an optical fiber 6, 12. Each temperature sensing section 8, 14 is arranged to produce, in response to an optical input signal, an optical output signal indicative of the temperature of the temperature sensing section 8, 14. The detection unit 20 is configured to determine a first temperature characteristic (e.g. a temperature) of the first cable 4 based on one or more of the optical output signals of one or more of the first temperature sensors 8 in use; and determine a second temperature characteristic (e.g. a temperature) of the second cable 10 based on one or more of the optical output signals of one or more of the second temperature sensors 14 in use. The detection unit 20 is configured to compare the first temperature characteristic with the second temperature characteristic; and detect a current imbalance between the first cable 4 and the second cable 10 based on the comparison of the first temperature characteristic with the second temperature characteristic.

The apparatus 2 makes use of the phenomenon that a change in the current in a cable 4, 10 results in a change of the temperature of the cable 4, 10. Specifically, an increase in the current results in an increase in the temperature, and vice versa. This is because current is a rate of charged particles (e.g. electrons) flowing through the cable 4, 10, and the higher the rate of flow of charged particles through the cable 4, 10, the higher the energy that is transferred to the cable particles via collisions with the charged particles, and hence the higher the temperature of the cable 4, 10. Accordingly, as an example, for similar cables 4, 10, if the temperature of the first cable 4 and the second cable 10 are determined to be the same or are within a certain tolerance, it can be deduced or inferred that the current is balanced between the cables 8, 10. However, if the temperature of the first cable 4 and the second cable 10 are different, for example differ by more than a certain tolerance, it can be deduced or inferred that there is current imbalance between the cables 4, 10. Accordingly, current imbalance between the cables 4, 10 can be detected based on a comparison of a determined temperature characteristic (e.g. temperature) of the first cable 4 and the second cable 8.

Detecting current imbalance between the cables 4, 10 may allow for a number of advantages. For example, the network 3 may be configured such that, under normal operating conditions of the network 3, electrical current carried by each cable 4, 10 is balanced. That is, the current carried by each cable 4, 10 is or should be the same, within a certain tolerance. As described in more detail below, a current imbalance between the cables 4, 10 (i.e. the current carried by each cable 4, 10 is not the same or the difference is more than a certain tolerance) can be problematic. It can therefore be advantageous to detect current imbalance between the cables 4, 10. For example, this may allow for action to be taken in response to detecting the current imbalance, for example issuing an alarm or triggering a mitigation action e.g. to reduce the current imbalance or prevent the current imbalance from continuing.

As a first example, as described in more detail below, the network 3 may be configured such that a given current carried by the network 3 between a source and consumer is shared across, for example shared equally across, the cables 4, 10. For example, the cables 4, 10 may be connected in parallel with one another so as to share the given current between them. In this case, under normal operating conditions, the current carried by each cable 4, 10 is, or at least should be, balanced. Current imbalance between the cables 4, 10 may occur, for example, where there is a fault or cut in a first cable 4, causing the current not carried by first cable 4 to be taken up instead by the second cable 10. As another example, current imbalance between cables 4, 10 may occur where, for example, there is a short circuit in the second cable 10 (i.e. an unintended route from the second cable with little or no impedance), for example to a ground, which may cause the current in the second cable 10 to increase. Accordingly, current imbalance may result in the second cable 10 carrying more current than it is rated for. This may, for example, present a fire risk and hence is advantageous to detect. In some examples, the apparatus 2 may be configured to trigger a mitigation action in response to detecting this current imbalance, for example triggering the source or another element of the network 3 to reduce the given current carried by the cables 4, 10, and/or triggering a fuse to blow to prevent the given current being carried by the cables 4, 10.

As a second example, as described in more detail below, the network 3 may be configured such that a first cable 4 carries alternating current of a first phase between a multi-phase source and a multiphase consumer, and a second cable 10 carries alternating current of a second, different, phase between the multiphase source and the multiphase consumer. For example, the first cable 4 may be connected to a first phase terminal of the multiphase source and the second cable may be connected to a second phase terminal of the multiphase source. In this case, under normal operating conditions, despite being of a different phase, the current carried by each cable is, or at least should be, balanced. Current imbalance between the cables 4, 10 may occur, for example, where there is a fault in one of the cables 4, 10 or where a consumer has been added, for example erroneously added, to the network 3. Current imbalance between the phases may, for example, damage the multiphase source and/or consumer, and hence is advantageous to detect. The apparatus 2 may be configured to trigger a mitigation action in response to detecting this current imbalance, for example triggering the multiphase source to shut down or alter its electrical energy generation characteristics. In some examples, if the temperature characteristics of any one of the cables 4, 10 becomes higher than a certain threshold (e.g. despite triggering the multiphase source to shut down or alter its electrical energy generation characteristics, or otherwise) the apparatus 2 may be configured to transmit a control signal to cause a fuse to break the electrical connection provided by any one of the cables 4, 10.

Detecting current imbalance using temperature sensors each being implemented by a temperature sensing section 8, 14 of an optical fiber 6, 12 allows for a number of advantages, for example as compared to detecting current imbalance using current sensors such as current transformers. As described in more detail below, these advantages include reduced weight and size. Reduction in size and weight can be particularly important in vehicles such as aircraft, where size and weight budgets may be limited.

As mentioned, the use of optical fiber may allow for reduced size and weight. For example, as compared to current sensors such as current transformers, optical fiber 6, 12 are relatively light weight and take up relatively little space. Further, whereas for larger voltage/current networks the size (and accordingly weight) of a current transformer needs to be accordingly larger to detect the current, the size and weight of the optical fiber 6, 12 are independent of the voltage/current carried by the cables. Accordingly, the size and weight saving may be particularly pronounced in high voltage/current networks 3. Further, whereas each cable 4, 10 must be passed through a respective spaced apart current transformer in order for each current transformer to measure current thereby taking up additional space, an optical fiber 6, 12 can e.g. run alongside each cable 4, 10 (or in other configurations) which is space efficient. Further, whereas, where the cables 4, 10 are bundled, the bundle needs to be separated out in order to run each cable through a respective current transformer in order to measure current, which takes up additional space, optical fiber 6, 10 can e.g. run alongside each cable (or in other configurations) within the bundle, which is space efficient. Moreover, whereas current sensors such as current transformers are susceptible to electromagnetic interference, for example from lightning strike or from other electrical components such as other cables, optical fiber 6, 12 are resistant to electromagnetic interference. Accordingly, the current imbalance detection may be more robust to such electromagnetic interference.

The reduction in space and weight can be of particular importance in vehicles such as aircraft where weight and size budgets are limited. In particular, for aircraft such as passenger aircraft for which propulsion is provided at least in part by an electric motor, a high voltage and/or current electrical energy distribution network 3 may be used to supply electrical energy to the electric motor. In these cases, due to their large size and weight, it may be difficult or not possible to integrate current sensors such as current transformers in a way that complies with the weight and/or space limitations imposed by the design of the aircraft. However, the reduced size and weight afforded by the use of optical fiber 6, 12 to detect current imbalance in the way described herein may allow for current imbalance detection to be practically implemented in such aircraft. Moreover, the resistance to electromagnetic interference afforded by the use of optical fiber 6, 12 may be of particular importance in vehicles such as aircraft where electromagnetic interference from lightning strike may be prevalent.

In some examples, the detecting unit 20 may be configured to detect the current imbalance based on a determination that a difference between the first temperature characteristic determined for the first cable 6 and the second temperature characteristic determined for the second cable 10 is greater than a threshold value. For example, it may be known or programmed that, under normal operating conditions, where the current is balanced between the first and second cables 4, 10, the temperature of the first and second cables should be the same. In some examples, current imbalance may be detected where the temperatures of the first and second cables 4, 10 are determined to be different, i.e. not the same, for example within the error margin associated with the temperature measurement. In some examples, a small difference in the temperature, and hence in the current carried by each cable 4, 10 may be tolerated before the detecting unit 20 detects current imbalance. For example, current imbalance may only be detected by the detecting unit where the temperatures differ by more than a threshold value, for example 5 degrees Celsius. This may help prevent spurious detection of current imbalance, and hence for the current imbalance detection to be more reliable.

In some examples, it may be known or programmed in the detecting unit 20 that, under normal operating conditions, where the current is balanced between the first and second cables 4, 10, the temperature of the first cable 4 is a first value, and the temperature of the second cable 10 is a second value. These temperature values need not necessarily be the same. For example, this may occur when there are (intended) differences between the first and second cables 4, 10. In any case, the detecting unit 20 may be configured to detect current imbalance between the two cables 4, 10 based on a comparison of the first and second temperatures, for example based on a difference between the two temperatures exceeding a suitable threshold value.

In some examples, a relationship between current and temperature may be known or derived by suitable calibration for each of the cables 4, 10. For example this may be over a suitable range of temperature and current. The detecting unit 20 may be programmed with the current-temperature relationship for each cable 4, 10. The detecting unit 20 may convert the determined temperature of a given cable 4, 10 into an estimate of the current in the given cable 4, 10, and detect a current imbalance between the cables 4, 10 based on the estimated current in each cable 4, 10. The estimated current in this example is nonetheless a temperature characteristic because it is inferred from the determined temperature of the cable.

In some examples, the detecting unit 20 may be configured to perform an action in response to detecting a current imbalance. For example, the detecting unit 20 may be configured to issue an alert, or for example transmit an alert or fault signal to a suitable user interface (not shown) to cause the user interface to indicate to an operator that a current imbalance has occurred or is occurring, and/or for example in which cables the current imbalance has occurred or is occurring. This may allow for an operator to take appropriate action, for example to take steps to mitigate the current imbalance. In some examples, the detecting unit 20 may be configured to, in response to detecting a current imbalance, trigger a mitigation action to reduce the current imbalance or prevent the current imbalance from continuing. For example, as described in more detail below, the detecting unit 20 may be configured to transmit a control signal to a fuse of the network 3 to cut an electrical connection of the cables 4, 10 and/or transmit a control signal to a source and/or a consumer of the network to shut down, or alter production or consumption of electrical energy. This may allow for a prompt mitigation of the current imbalance, and therefore a reduction in the risk of damage to the electrical energy distribution network 3 that may be associated with current imbalance.

In some examples, as illustrated in FIG. 1, the apparatus 2 may comprise a plurality of optical fiber 6, 12 (two as illustrated). One or more first temperature sensors 8 may be implemented by temperature sensing sections 8 of a first optical fiber 6, and one or more second temperature sensors 14 may be implemented by temperature sensing sections 14 of a second, different, optical fiber 12. In the example illustrated in FIG. 1, the first optical fiber 6 runs along the length of the first cable 4 and the second optical fiber 12 runs along the length of the second cable 10. In general, there may be one optical fiber 6, 12 per cable 4, 10 for which it is desired to determine a temperature characteristic. Other arrangements are possible, but the illustrated arrangement provides for an implementation with relatively low complexity.

In some examples, as illustrated in FIG. 1, there may be a plurality of the first temperature sensors 8 configured for thermal contact at respective different points along a length of the first cable 4. There may also be a plurality of the second temperature sensors 14 configured for thermal contact at respective different points along a length of the second cable 10. In some examples, for a given optical fiber 6, 12, the temperature sensing sections 8, 14 may be equally spaced along the fiber 6, 12. Having a plurality of temperature sensing sections 8, 14, for example along the length of a single optical fiber 6, 12, may allow for temperature monitoring along a length of the associated cable 4, 10, and which is sensitive to local variations in temperature along the length of the cable 4, 10. This may provide for a more precise and/or more comprehensive temperature determination, and hence for improved detection of current imbalance. For example, the detecting unit 2 may be configured to determine a first temperature characteristic at a given location along the length of the first cable 4, and a second temperature characteristics at a corresponding location along the length of the second cable 10, and compare these in order to detect current imbalance in the cables 4, 10. This may allow for detection of localised current imbalances, that may arise for example due to a local connection fault or short. As another example, alternatively or additionally, the detecting unit 2 may be configured to determine temperature characteristics for each cable 4, 10 by taking an average of each of the temperature characteristics for each of the temperature sensing sections 8, 14 along a given cable 4, 10, and comparing the average for the first cable 4 and the average for the second cable 10 in order to detect a current imbalance. This may allow for a reliable detection of a current imbalance between cables 4, 10 taken as a whole by suppressing relatively small local variations in temperature, for example.

In some examples, as illustrated in FIG. 1, the detecting unit 20 may comprise an optical interrogator 22 and a processing unit 23. The optical interrogator may be configured to provide the optical input signal to each of the temperature sensing sections 8, 14, and receive the optical output signal from each of the temperature sensing sections 8, 14. Specifically, in this example, the optical interrogator 22 is in optical communication with the first optical fiber 6 and the second optical fiber 12. For example, each of the first and second optical fiber 6, 12 may be connected to the optical interrogator 22 via a suitable port (not shown). The optical interrogator 22 is arranged to provide an optical input signal to, and receive an optical output signal from, one or more of the first temperature sensing sections 8 of the first optical fiber 6, and to provide an optical input signal to, and receive an optical output signal from, one or more of the second temperature sensing sections 14 of the second optical fiber 12. The optical interrogator 22 comprises a light source (not shown) for generating the optical input signals, and an optical detector (not shown) for detecting the output optical signals.

In some examples, as illustrated in FIG. 1, the optical interrogator 22 is connected to the processing unit 23 and is configured to provide the detected output optical signals, for example in the form of digital data over a suitable data link, to the processing unit 23. The processing unit 23 is arranged to determine a temperature characteristic of each of the first and second cables 4, 10 based on the detected optical output signals. For example, the processing unit 23 may comprise a processor and a memory (not shown) arranged to process the detected output optical signals and determine on the basis of these, by suitable calibration, a temperature associated with each of the temperature sensing sections 8, 14. In other examples, this determination may be performed by the optical interrogator 22 itself. The temperature characteristic may be, for example, the temperature, or some other parameter indicative of the temperature, of the temperature sensing section and hence the cable 4, 10 with which it is in thermal contact.

A change in the temperature of a temperature sensing section 8, 14 may cause a change in a scattering characteristic of the temperature sensing section 8, 14, which may cause a change in the optical output signal produced by the temperature sensing section 8, 14 in response to an optical input signal. That is, the optical input signal may experience temperature dependant scattering at a temperature sensing section 8, 14 which scattered light may form the optical output signal.

In some examples, one or more of the temperature sensing sections 8, 14 is arranged for temperature dependant optical back-scattering of the optical input signal thereby to produce the optical output signal. That is, the optical input signal may travel in a first direction along the first optical fiber 6, 12, and the optical input signal may experience temperature dependant scattering at a temperature sensing section 8, 14, and the scattered light forming the optical output signal may travel in a second direction along the optical fiber 6, 12, opposite to the first direction. This may allow a reduction in the length of the optical fiber 8, 14 needed to determine the temperature of each cable 4, 10.

In some examples, one or more of the temperature sensing sections 8, 14 comprises a Fiber Bragg Grating (FBG). A FBG is a distributed Bragg reflector located within the optical fiber 6, 12 and comprising periodic variations in the refractive index of the core of the fiber 6, 12 along a section of the length of the optical fiber 6, 12. The wavelength of a band of light reflected from the FBG is dependent on temperature of the section 6, 12. When an FBG is in thermal contact with (for example bonded to, attached to, tightly wound around, or embedded in) a cable 4, 10 of the electrical energy distribution network, a change in temperature of the cable 4, 10 changes a temperature of the FBG, which in turn changes the wavelength of a band of light reflectable by the FBG. Therefore, by monitoring light reflected (forming the output optical signal) from an FBG in thermal contact with the cable 4, 10, the temperature of the cable 4, 10 (or a specific portion thereof) may be determined.

A plurality of the temperature sensing sections 8, 14 of a given optical fiber 6, 12 may each comprise an FBG. For example, the range of wavelengths reflectable by one FBG located in a fiber may be different from the range of wavelength reflectable by a second FBG in the same fiber. A first FBG may therefore be transparent to a range of wavelengths needed to interrogate a second FBG, and the first and second FBGs may be transparent to a range of wavelengths needed to interrogate a third FBG, and so on. As a result, multiple temperature sensing sections 8, 14 may be located in a single given optical fiber 6, 12, which may reduce the weight and complexity of connections needed to interrogate the temperature sensing sections 8, 14. The identity and hence location of a particular one of the FBGs interrogated may be determined based on the range of input optical signal wavelengths used for interrogation and/or the range of wavelengths of the output optical signal received.

In some examples, other types of temperature sensing sections 8, 14 may be used. For example, one or more of the temperature sensing sections 8, 14 may be arranged for Brillouin scattering and/or Raman scattering or the like. In these examples, the optical fiber 6, 12 itself, or a portion thereof, may constitute a temperature sensing section 8, 14. In Brillouin scattering examples, the optical input interacts with material deformation waves, for example phonons, in the optical fiber 6, 12, the properties of which phonons may vary with temperature. A light wave of the optical input signal interacts with a deformation wave of the optical fiber 6, 12 to produce a scattered light wave, which may have a different frequency to the optical input signal. The scattered light wave may then be used as the temperature dependant optical output signal. For example, the frequency shifts as a result of Brillouin scattering as compared to the frequency of the input optical signal may be detected with an interferometer. In Raman scattering, the optical input signal is scattered by excitation of vibrational and rotational transitions of molecules of the optical fiber 6, 12, the properties of which scattered light may vary with temperature of the optical fiber 6, 12. The scattered light may then be used as the temperature dependant optical output signal. For example, the optical output signal produced as a result of Raman scattering as compared to the input optical signal may be detected with an interferometer or a grating spectrometer, for example.

For both the Brillouin and Raman scattering examples (and other scattering examples), the temperature of a particular location along the optical fiber 8, 12 may be determined based on time-of-flight techniques. For example, the interrogator 22 may measure the time between sending of the optical input signal and receipt of the optical output signal and use this time in conjunction with the speed of light in the optical fiber 6, 12 to determine the distance along the optical fiber 6, 12 at which the optical output signal was produced.

Figure 2:
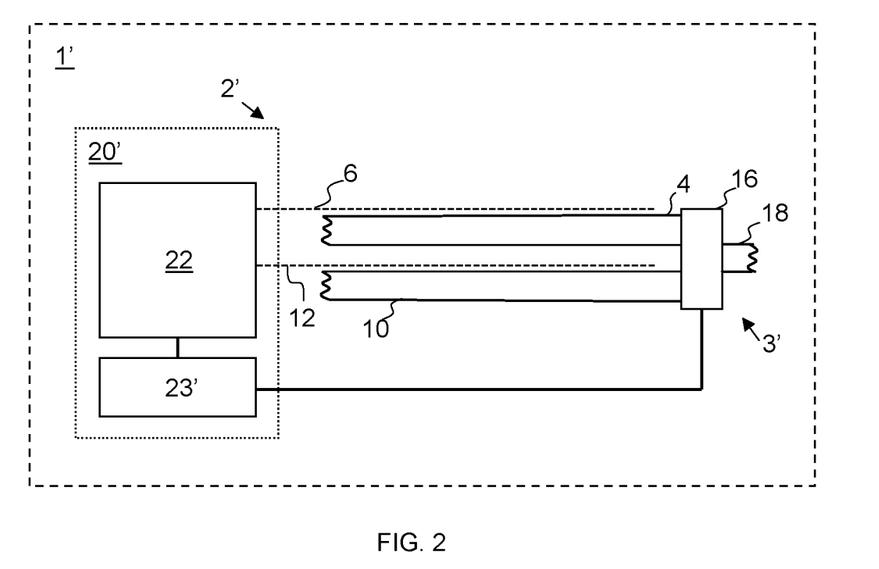
FIG. 2 is a schematic diagram that illustrates an apparatus, according to an example of the invention.

Referring now to FIG. 2, there is illustrated a system 1' in which an example of mitigation of detected current imbalance is implemented. The system 1' of FIG. 2 is similar to the system 1 of FIG. 1, and like components are given like reference signs. Similarly to as for FIG. 1, the system 1' illustrated in FIG. 2 comprises an apparatus 2' and a network 3'. The network 3' comprises cables 4, 10 as per the examples of FIG. 1. However, in the example of FIG. 2, the network 3' also comprises a common cable 18 and a fuse 16. In the example of FIG. 2, the network 3' is configured such that a given current carried by the network 3' is shared across the two cables 4, 10. This given current is recombined into a common cable 18, which may, for example, be electrically connected to a terminal of an electrical consumer, for example an electric motor (not shown in FIG. 2). The fuse 16 is located in the network so as to, on activation, break the electrical connection provided by each of the cables 4, 10 to the common cable 18. Similarly to the apparatus 2 of FIG. 1, the apparatus 2' of FIG. 2 comprises a detection unit 20' and the temperature sensing optical fiber 6, 12 in thermal contact with the cables 4, 10, respectively. The detecting unit 20' is similar to that of FIG. 1 in that it comprises an optical interrogator 22 and a processing unit 23'. However, the processing unit 23' in the example of FIG. 2 is configured for communication with the fuse 16.

In the example of FIG. 2, the detecting unit 20' (in this example specifically the processing unit 23') is configured to: responsive to a current imbalance being detected, transmit a control signal to the fuse 16 to cause the fuse 16 to break the electrical connection provided by each of the cables 4, 10. For example, the fuse 16 may be a Pyro-fuse, which when provided with an ignition signal by the detecting unit 20' may act to physically break the connection between the cables 4, 10 and the common cable 18. Fuses which can be activated by external control signals such, such as Pyro-fuses, may be useful in situations where, for example, a typical thermal fuse may not be able to break the connection within a required time. The system 1' of FIG. 2 may help prevent uncontrolled overheating, and hence reduce fire risk. For example, if there is a cut in first cable 4, then the given current which under normal conditions is shared between the cables 4, 10 will be taken up solely by the second cable 10, but which may not be rated to carry this higher current and hence which may overheat. The current imbalance is detected by the detection unit 20' and the detection unit 20' transmits a control signal to the fuse 16. The fuse 16 activates to breaks the electrical connection of both cables 4, 10 to the common cable (and hence the electrical consumer to which the given current is being provided), and hence stops current flowing in both of the cables 4, 10, thereby preventing the current imbalance from continuing, thereby helping to prevent overheating, thereby reducing fire risk.

In some examples, the detecting unit 20' may be configured to: responsive to a determination that the determined temperature characteristic of a given electrical energy distribution cable 4, 10 is higher than a given temperature limit, transmit a control signal to a fuse 16 associated with the given electrical energy distribution cable 4, 10 to cause the fuse to break the electrical connection provided by the given electrical energy distribution cable 4, 10. This may provide an additional fail-safe mechanism in case any cable 4, 10 becomes too hot. For example, if there were to be a fault somewhere on the network 3' causing both of the cables 4, 10 to carry more current that the cables are rated for 4, 10, then while a current imbalance may not be detected, it may nonetheless be determined that the determined temperature of either one of the cables 4, 10 is above a given temperature limit, for example above a temperature which might otherwise pose a fire risk. In response to this, the detecting unit 20' may be configured to transmit a control signal to the fuse 16 (and/or another such fuse associated with a cable 4, 10 for which the determined temperature is determined to be above a temperature limit, not shown) to cause the fuse to break the electrical connection provided by the cable 4, 10 in order to stop the cable 4, 10 from carrying current and hence help prevent the overheating.

In some examples, the detecting unit 20' may be configured to: responsive to a current imbalance being detected, transmit a control signal to an electrical energy source (not shown in FIG. 2) of the network 3' to reduce a current carried by the cables 4, 10. Triggering the source (not shown) or another element of the network 3' to reduce the current carried by the cables 4, 10 may allow, for example where the first cable 4 has been cut, for the second cable 10 to nonetheless continue to distribute electrical energy, albeit with reduced current, to the consumer (not shown). Since the current is reduced, for example to within the rating of the second cable 10, the fire risk posed by the current imbalance may be mitigated but nonetheless electrical energy may continue to be delivered to the consumer. This may be particularly advantageous in examples where it is important that electrical energy continues to be delivered to the consumer, for example where the consumer is a propulsion system of a vehicle such as an aircraft.

Nonetheless, triggering a fuse to blow to prevent the given current being carried by the cables 4, 10 may allow, for example, where there is a fault or short in one of the cables 4, 10 to mitigate a fire risk associated with the fault or short. Accordingly, in some examples, the detecting unit 20' may be configured to, when a current imbalance is detected, first attempt to mitigate an increase in temperature of one of the cables 10 by triggering the reduction in current carried by the cables 4, 10, but if this is not successful in reducing the temperature of the cable 10 (e.g. as determined from the one or more temperature sensors in thermal contact with the cable 10), then trigger the fuse 16 to blow. As such, in some examples, the detecting unit 20' may be configured to, when current imbalance is detected, transmit a first control signal to a source or another (e.g. current limiting) element (not shown) of the network 3' to reduce the current carried by the cables 4, 10; subsequently monitor the first and second temperature characteristics of the first and second cables 4, 10, respectively; determine based on the monitoring that one or both of the first and second temperature characteristics are above a threshold value; and responsive to the determination based on the monitoring that one or both of the first and second temperature characteristics are above a threshold value (e.g. above a temperature rating for the cable), transmit a second control signal to the fuse 16 to cause the fuse 16 to break the electrical connection provided by the cables 4, 10. This may allow for electrical energy to be provided to the consumer where possible but whilst also mitigating fire risk in case of a fault such as a short.

Figure 3:
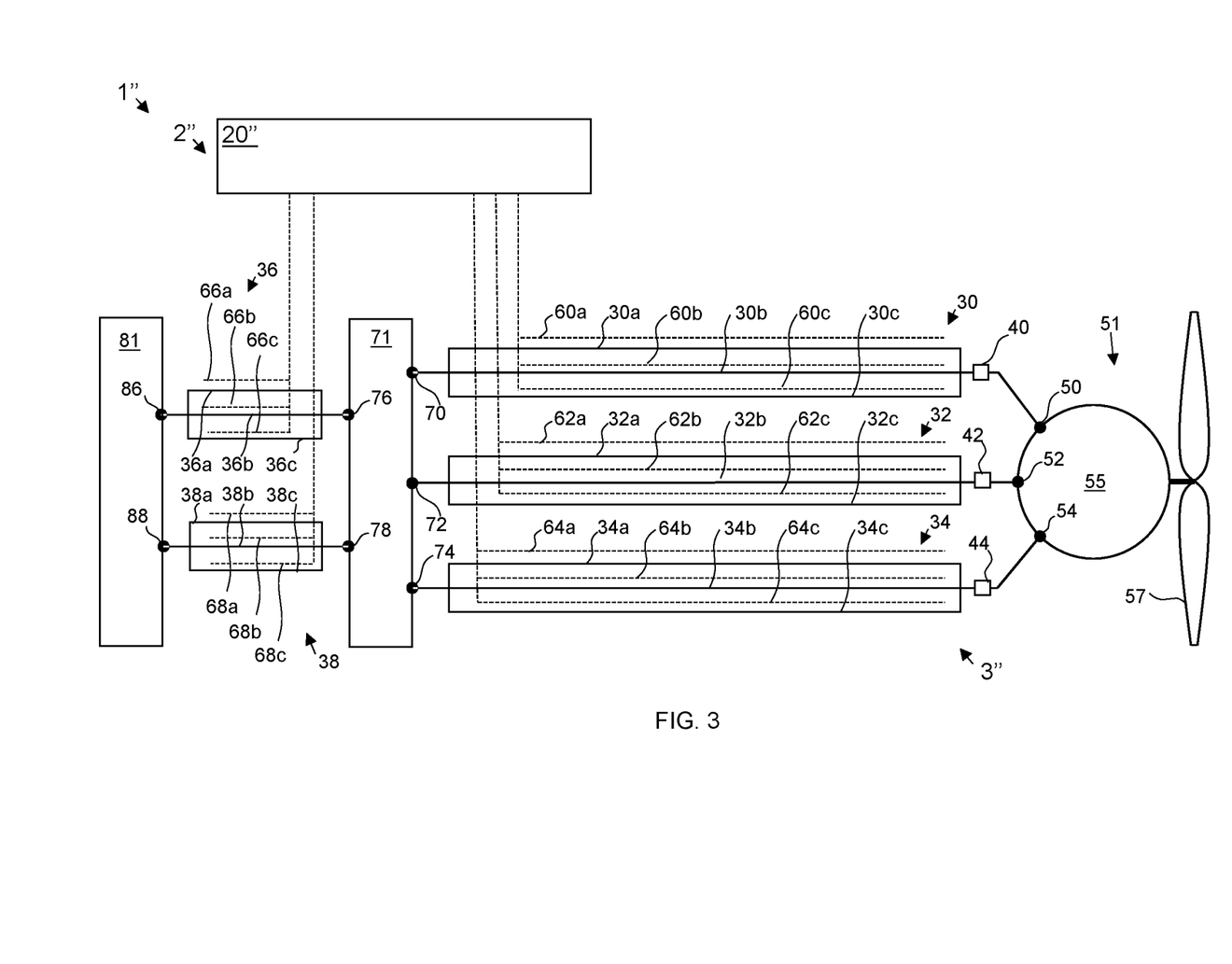
FIG. 3 is a schematic diagram that illustrates an apparatus, according to an example of the invention.

Referring now to FIG. 3, there is illustrated a system 1" comprising an apparatus 2" and an electrical energy distribution network 3", according to an example. The network 3" comprises a DC source 81, an inverter 71, and an electrical energy consumer 55. The DC source 81 may, for example, be or comprise a battery or other DC generator. The inverter 71 is configured to take direct current provided by the DC source 81 and transform it into multiphase, in this example three phase, alternating current for use by the electrical energy consumer 55. Inverters which provide this functionality are known per se. The direct current is carried between the DC source 81 and the inverter 71 by two DC electrical energy distribution lines (hereinafter 'DC lines') 36, 38. Each of these DC lines 36, 38 comprise three current carrying cables 36*a*, 36*b*, 36*c*, 38*a*, 38*b*, 38*c* over which a given direct current carried by the respective DC line 36, 38 is equally shared. A first of these DC lines 36 connects a first terminal 86 of the DC source 81 with a first DC terminal 76 of the inverter 71, and a second of these DC lines connects a second terminal 88 of the DC source 81 with a second DC terminal of the inverter 71.

The alternating current produced by the inverter 71 is carried between the inverter 71 and the consumer 55 by three AC electrical energy distribution lines (hereinafter 'AC lines') 30, 32, 34. Each of these AC lines 30, 32, 34 comprise three current carrying cables 30*a*, 30*b*, 30*c*, 32*a*, 32*b*, 32*c*, 34*a*, 34*b*, 34*c* over which a given alternating current carried by the respective AC line 30, 32, 24 is equally shared. A first AC line 30 carries alternating current of a first phase between a first phase terminal 70 of the inverter 71 and a first phase terminal 50 of the consumer 55, a second AC line 32 carries alternating current of a second phase between a second phase terminal 72 of the inverter 71 and a second phase terminal 52 of the consumer 55, and a third AC line 34 carries alternating current of a third phase between a third phase terminal 74 of the inverter 71 and a third phase terminal 54 of the consumer 55. For example, each of the first, second, and third phase of alternating current differ by 120 degrees. Each AC line 30, 32, 34 comprises a respective fuse 40, 42, 44 configured to break the electrical connection between the inverter 71 and the consumer 55 provided by each AC line 30, 32, 34, respectively. For example, similarly to as described for FIG. 2, each fuse 40, 42, 44 may be configured to receive a control signal from the apparatus 20" that causes the fuse to break the electrical connection with which it is associated.

In some examples, as illustrated in FIG. 3, the electrical energy consumer may be an electric motor 55. In this example, the electric motor 55 is part of a propulsion system 51 of a vehicle, specifically an aircraft (not shown in FIG. 3 but see FIG. 5). In this example, the propulsion system comprises the electric motor 55 and a propeller 57, wherein the electric motor is configured to drive the propeller 57. The electric motor 55 may therefore be referred to as a vehicle electrical propulsion motor. Accordingly, in this example, the network 3" is a vehicle's electrical energy distribution network 3", specifically, an electrical energy distribution network 3" of an aircraft (not shown in FIG. 3). The propulsion system 51 may be the sole propulsion system 51 of the aircraft, or may be combined with one or more other propulsion systems (not shown). For example, the electrical propulsion motor 55 may be used in combination with jet engines (not shown), for example to provide for a 'hybrid' aircraft.

Under normal operating conditions, the current carried by each of the AC lines 30, 32, 34 is or should be the same, for example within a certain tolerance. The current carried by each of the DC lines 36, 38 should be the same, for example within a certain tolerance. Further, under normal operating conditions, the current carried each of the cables within a given one of the lines 30, 32, 24, 36, 38 is or should be the same, for example within a certain tolerance. Current imbalance between two or more of the cables in each of these contexts may be detected by the apparatus 2".

In this example, the apparatus 2" comprises a plurality of temperature sensing optical fiber 60a, 60b, 60c, 62a, 62b, 62c, 64a, 64b, 64c, 66a, 66b, 66c, 68a, 66b, 66c, one for each of (and in thermal contact with) the cables 30a, 30b, 30c, 32a, 32b, 32c, 34a, 34b, 34c, 36a, 36b, 36c, 38a, 38b, 38c of the network 3". Each of the optical fiber 60a-66c may be the same as or similar to the optical fiber 6, 12 described above with reference to FIGS. 1 and 2. Similarly to the example in FIGS. 1 and 2, the apparatus 2" of FIG. 3 comprises a detecting unit 20". The detecting unit 20" may comprise an optical interrogator and a processing unit for example as described in the Figures above, but for clarity these are not shown in FIG. 3. In any case, the detecting unit 20" is configured to, for each of the cables 30a-38c, determine a temperature characteristic of the cable 30a-38c based on the optical output signal of a temperature sensing section of the respective one of the optical fiber 60a-66c with which the cable 30a-38c is in thermal contact. The detecting unit 20" is configured to compare two or more of the determined temperature characteristics and based on the comparison detect a current imbalance between a respective two or more of the cables 30a-38c.

In some examples, in addition to determining first and second temperature characteristics of first and second cables based on optical output signals from temperature sensors in thermal contact with first and second cables as described above with reference to FIGS. 1 and 2, the detecting unit 20" may be configured to determine a third temperature characteristic of a third electrical energy distribution cable based on one or more of the optical output signals of a third temperature sensor in thermal contact with a third cable in use; and detect a current imbalance between two or more of the first, second and third cables based on a comparison of the first, second and third temperature characteristics.

As one example, the detecting unit 20" may be configured to determine and compare the temperature characteristics for each of the three cables in any given line 30, 32, 24, 36, 38. For example, the detecting unit 20" may determine the temperature characteristics of each of the three cables 30, 30b, 30c of the first AC line 30 based on the optical output signal of one or more temperature sensing sections of each of the corresponding optical fiber 60a, 60b, 60c. The detecting unit 20" may compare the temperature characteristics of each cable 30a, 30b, 30c. and detect current imbalance based on the comparison. For example, if the temperatures of all three of the cables 30a, 30b, 30c are the same or are within a certain tolerance range of one another, the detecting unit 20" may not detect current imbalance, or determine that the current is balanced between the cables 30a, 30b, 30c. However, if the temperature a first of the cables 30a differs, for example differs by more than a threshold amount, from the temperature of one or both of the other cables 30b, 30c, then the detecting unit 20" may detect a current imbalance between the first cable 30a and one or both of the other cables 30b, 30c. In some example, if the detecting unit 20" detects a current imbalance between the first cable and one or both of the other cables 30b, 30c, then the detecting unit 20" may send a control signal to the first fuse 40 associated with the first AC line 30 to cause the electrical connection provided by the first AC line 40 to break, and hence prevent the detected current imbalance from continuing.

In some examples, the detecting unit 20" may be configured to infer, based on the determined temperature characteristics, which of the cables 30a, 30b, 30c is associated with a fault causing the detected current imbalance. For example, if a first of the cables 30a is cut, then the current that was carried by the first cable 30a will be taken up instead by the other two cables 30b, 30c. Accordingly, if the determined temperature characteristics of two of the cables 30b, 30c increases relative to a first cable 30a, then it may be inferred that the fault is with the first cable 30a, specifically that the first cable 30a has been cut. As another example, if the first cable 30a develops a short, for example with a ground, then the current in that cable 30a and hence the temperature of the cable 30a will increase, but the temperature of the other two cables may not change significantly. Similarly, if one of the cables 30a has not been installed correctly onto a busbar (not shown) then there may develop a hot spot on that cable 30a, but the temperature of the other two cables 30b, 30c may not change significantly. Accordingly, if the determined temperature characteristic of one of the cables 30a increases relative to the other two cables 30b, 30c, then it may be inferred that the fault is with the first cable 30a, specifically that the first cable 30a is experiencing a short or has a faulty connection. In examples where temperature characteristics are determined locally on a given cable, an increase in temperature characteristic on a given portion of a cable may alternatively or additionally be used to infer the presence of a hotspot, and hence for example the presence of a faulty connection. In some examples, if the output signal from any one of the optical fiber 60a, 60b, 60c is lost, then it may be inferred that the optical fiber and hence potentially the cable 30a, 30b, 30c with which it is associated has been cut, and hence the fault is with that cable. Inferring which of the cables 30a, 30b, 30c is or may be at fault and/or may be a cause of the detected current imbalance may allow, for example, for mitigation actions to be more precisely directed. For example, the mitigation actions may be more precisely directed at the cause of the detected current imbalance.

As another example, alternatively or additionally, the detecting unit 20" may be configured to determine and compare the temperature characteristics for a cable (or a number of cables) from each AC line 30, 32, 34 (or for example from each DC line 36, 38). For example, the detecting unit 20" may be configured to compare the temperature characteristic of a first cable 30a from the first AC line 30, a second cable 32a from the second AC line 32, and a third cable 34a from the third AC line 34. As another example, the detecting unit 20" may be configured to determine an average temperature characteristic for each AC line 30, 32, 34 based on an average of the temperature characteristics for each of the cables from within a given AC line 30, 32, 34. In either case, under normal operating conditions, although the phase of alternating current in each AC line 30, 32, 24 is different, the current carried by each AC line 30, 32, 34 is or should be the same or within a certain tolerance of each other. Accordingly, if the temperature characteristic associated with each AC line 30, 32, 34 is the same, or are within a certain tolerance of one another, then the detecting unit 20" may not detect current imbalance. However, if the temperature characteristic associated with one of the AC lines 30 differs from the one or both of the temperature characteristics associated with the other two AC lines 32, 34, for example differs by more than a threshold amount, then the detecting unit 20" may detect a current imbalance. For example, current imbalance between the AC lines 30, 32, 34 may occur, for example, where there is a fault in at a terminal connection 70, 72, 74, 50, 52, 54 of one of the AC lines 30, 32, 34 or where an additional consumer (not shown in FIG. 3) has been added, for example erroneously added, to the network 3". Current imbalance between the AC lines 30, 32, 34 may, for example, damage the inverter 71 and/or the consumer 55. In these examples, the apparatus 2" may be configured to trigger a mitigation action in response to detecting this current imbalance. For example, the apparatus 2" may be configured to trigger the inverter 71 and/or the DC source 81 to shut down, or for example trigger the inverter 71 to alter its electrical energy generation characteristics, for example, modify the inversion process so as to mitigate or eliminate the detected current imbalance.

Similarly to as described above for cables within a given line, the detecting unit 20" may be configured to infer, based on the determined temperature characteristics, which of the phase lines 30, 32, 34 is associated with a fault causing the detected current imbalance. For example, if the temperature characteristic of the first AC line 30 is higher than the temperature characteristic of the other two AC lines 32, 34 which are the same as one another, the detecting unit 2" may infer that the first AC line 30 is associated with the cause of the current imbalance. For example, the detecting unit 2" may send a control signal to the inverter 71 to cause the inverter 71 to reduce the current output from the first phase terminal 70 in to the first AC line 30 relative to the current output from the second phase terminal 72 and the phase terminal 74, thereby mitigating the current imbalance.

In some examples, the apparatus 2" may be configured to detect both a current imbalance between cables within a given AC line 30, 32, 34 and a current imbalance between cables of different AC lines 30, 32, 34, for example a described above. For example, a first cable 30a and second cable 30b may be configured to carry alternating current of a first phase from the multiphase source 71 to the multiphase consumer 55, and a third cable 32a may be configured to carry alternating current of a second, different, phase from the multiphase source 71 to the multiphase consumer 55. The detecting unit 20' may be configured to: based on a comparison of the first and second temperature characteristics determined for the first and second cables 30a, 30b respectively, detect a first current imbalance within the first phase; and based on a comparison of the first and/or second temperature characteristics determined for the first and/or second cables 30a, 30b respectively with the third temperature characteristic determined for the third cable 32a, detect a second current imbalance between the first and second phases. This may allow for a large coverage and/or flexibility of the apparatus 2" in the current imbalance it is able to detect.

Although in the example of FIG. 3 the network 3" delivers three phase alternating current from the inverter 71 to the consumer 51, it will be appreciated that this need not necessarily be the case and that other multiphase electrical sources and consumer may be used. For example, the network may be configured to deliver 6 phases of alternating current from a 6-phase inverter 71 to a 6-phase consumer. It will be appreciated that in these examples, the number of temperature sensing optical fiber can be adapted (i.e. increased or decreased) as appropriate in accordance with the number of cables between which it is desired to detect current imbalance. Indeed, the apparatus 2" may provide a flexible and scalable way to detect current imbalance between cables of an electrical energy distribution network 3.

Figure 4:
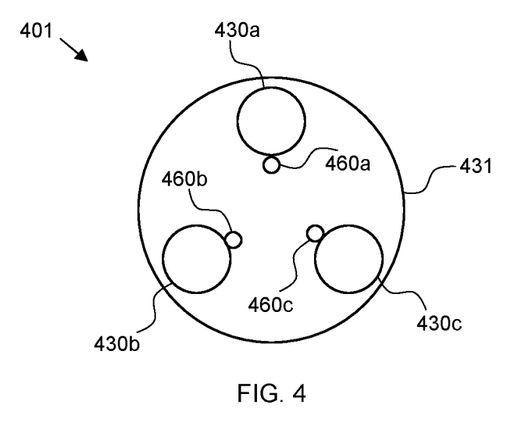
FIG. 4 is a schematic diagram that illustrates a cross sectional view of a bundle of electrical energy distribution cables, according to an example of the invention.

Referring now to FIG. 4, there is illustrated in cross section an example line 401 that may be used. For example, any one of the lines 30, 32, 34, 36, 38 described above with reference to FIG. 2 may be structured according to the example line 401 illustrated in FIG. 4. In some examples, as is illustrated in FIG. 3, each of the electrical energy distribution cables 430a, 430b, 430c of a given line 401 may be provided together as a bundled cable 401. For example, each cable 430a, 430b, 430c may be wrapped or otherwise protected by a protective layer 431 surrounding all of the cables 430a, 430b, 430c in the bundle. Moreover, in some examples, as illustrated in FIG. 3, the optical fiber 460a, 460b, 460c by which the temperature sensing sections for each cable 430a, 430b, 430c are provided, respectively, are embedded in the bundled cable 401. Specifically, in the illustrated example, each optical fiber 460a, 460b, 460c is in thermal contact with and runs along the length of its respective cable 430a, 430b, 430c. In the illustrated example, each optical fiber 460a, 460b, 460c is located on an interior side of the respective cable 430a, 430b, 430c, that is on a side of the cable 430a, 430b, 430c that is opposite to that of the surrounding protective layer 431. This arrangement may help protect the optical fiber 460a, 460b, 460c from damage. Embedding the optical fiber within the bundled cable 401 may protect the optical fiber from damage or from influence by external factors, and/or provide a space efficient arrangement.

Figure 5:
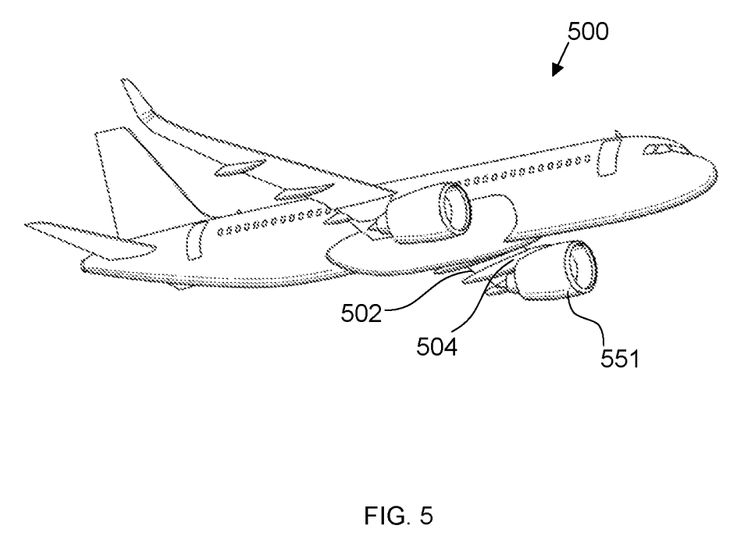
FIG. 5 is a schematic diagram that illustrates a perspective view of a vehicle, specifically a passenger aircraft, in which the apparatus may be used, according to an example of the invention.

Referring to FIG. 5, there is illustrated a vehicle 500 with which the apparatus according to any one of the examples described herein may be used. The vehicle 500 may comprise the system, apparatus, and/or network described with reference to any one of FIGS. 1 to 4. In this example, the vehicle is an aircraft 500, specifically a passenger aircraft 500. Similarly to the example of FIG. 3, the network (not visible in FIG. 5) may distribute electrical energy to a propulsion system 551 of the aircraft 500, for example comprising an electrical propulsion motor driving a propeller. The propulsion system 551 may be connected to the wing of the aircraft by means of a pylon 504.

In some examples, it may be desirable to detect current imbalance between the cables, and hence determine the temperature of the cables, as close to the electrical energy consumer (in this example the propulsion system 551) as possible. In the example of the consumer being the electric propulsion system 551, the closest available measuring point may be in the wing portion 502, specifically the pylon 504. In some examples, it may be particularly important to detect current imbalance occurring in the wing portion 502, e.g. the pylon 504 of the aircraft 500, as these are particularly critical portions of the aircraft 500, and in the case of hybrid prolusion systems may be located close to fuel. In either case, in some examples, one or more of the temperature sensors described above with reference to any one of FIGS. 1 to 4 may be located in the wing portion 502 of the aircraft 500, for example the pylon 504 of the aircraft 500. The use of temperature sensing sections of optical fiber to detect current imbalance as per the examples described herein may be particularly advantageous in environments such as in a wing portion 502 specifically a pylon 504 of an aircraft 500. Firstly, a wing of an aircraft 500, and specifically the pylon 504, is a space limited and cluttered environment, and the amount and shape of the space provided within these elements is highly constrained by aerodynamic considerations. Accordingly, the relatively small size of the optical fiber, and/or their integration within the cables may be particularly beneficial in these cases. Secondly, a wing, e.g. a pylon, of an aircraft 500 is an unpressurised environment and may comprise pollutants such as de-icing fluid. While current sensors such as current transformers can be difficult to isolate from such pollutants and hence difficult to integrate into such unpressurised environments, the optical fiber used herein to detect current imbalance are inherently isolated from such pollutants and hence may be simpler to integrate.

Figure 6:
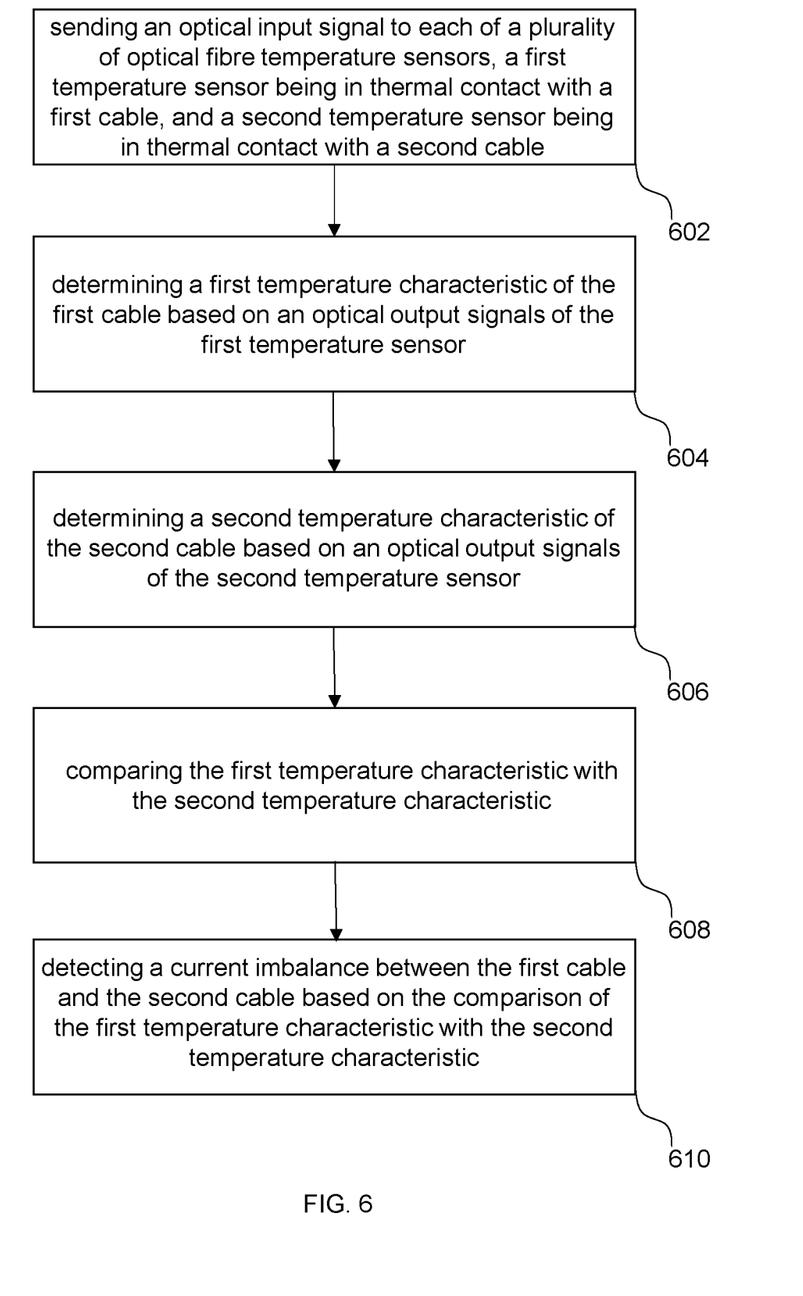
FIG. 6 is a schematic diagram that illustrates a method according to an example of the invention.

Referring to FIG. 6, there is illustrated a method of detecting current imbalance between two or more electrical energy distribution cables 4, 10, 30a-38c of an electrical energy distribution network 3, 3', 3", according to an example. The electrical energy distribution network and the cables referred to may be the same or similar to the network 3, 3', 3" and the cables 4, 10, 30a-38c, respectively, according to any of the examples described above with reference to FIGS. 1 to 5. The method may be implemented or carried out by the apparatus 2, 2', 2" according to any one of the examples described above with reference to FIGS. 1 to 5.

In step 602, the method comprises sending an optical input signal to each of a plurality of temperature sensors, each temperature sensor being implemented by a temperature sensing section 8, 14 of an optical fiber 6, 12, 60a-68c, each temperature sensing section being arranged to produce, in response to the optical input signal, an optical output signal indicative of the temperature of the temperature sensing section 8, 14. One or more first temperature sensors 8, 14 of the plurality of temperature sensors are in thermal contact with a first electrical energy distribution cable 4, 10, 30a-38c of the electrical energy distribution network 3, 3', 3"; and one or more second temperature sensors 8, 14 of the plurality of temperature sensors are in thermal contact with a second, different, electrical energy distribution cable 4, 10, 30a-38c of the electrical energy distribution network 3, 3', 3". The temperature sensing sections and the optical fiber referred to may be the same or similar to the temperature sensing sections 8, 14 and the optical fiber 6, 12, 60a-68c, respectively, according to any of the examples described above with reference to FIGS. 1 to 5.

In step 604, the method comprises determining a first temperature characteristic of the first electrical energy distribution cable 4, 10, 30a-38c based on one or more of the optical output signals of the one or more first temperature sensors 8, 14. The first temperature characteristic may be determined according to any of the examples described above with reference to FIGS. 1 to 5.

In step 606, the method comprises determining a second temperature characteristic of the second electrical energy distribution cable 4, 10, 30a-38c based on one or more of the optical output signals of the one or more second temperature sensors 8, 14. The second temperature characteristic may be determined according to any of the examples described above with reference to FIGS. 1 to 5.

In step 608, the method comprises comparing the first temperature characteristic with the second temperature characteristic. The comparison may be according to any of the examples described with reference to FIGS. 1 to 5.

In step 610, the method comprises, detecting a current imbalance between the first electrical energy distribution cable 4, 10, 30a-38c and the second electrical energy distribution cable 4, 10, 30a-38c based on the comparison of the first temperature characteristic with the second temperature characteristic. The detection may be according to any of the examples described with reference to FIGS. 1 to 5.

In some examples, step 602 may be carried out by the optical interrogator 22 according to any of the examples described above with reference to FIGS. 1 to 5. In some examples, steps 604 to 610 may be carried out by the processing unit 23, 23' according to any of the examples described above with reference to FIGS. 1 to 5. In some examples, the processing unit 23, 23' may be incorporated into the optical interrogator 22. In some examples, the apparatus 2, 2', 2" (e.g. the optical interrogator or the processing unit or both) may comprise a memory having instructions stored thereon which when executed by a processor of the apparatus 2, 2', 2" (e.g. a processor of the optical interrogator or the processing unit or both) cause the apparatus 2, 2', 2" to perform the method of FIG. 6.

In some examples, the method may comprise additional steps. For example, the method may comprise carrying out the functionality of the apparatus 2, 2', 2" according to any of the examples described above with reference to FIGS. 1 to 5.

Accordingly, a method and apparatus are provided that, for example, allow for a reduction in the weight of and space taken up by current imbalance detection, and hence which mitigate at least some of the drawbacks of the prior art.

It is noted that the term "or" as used herein is to be interpreted to mean "and/or", unless expressly stated otherwise.

The above examples are to be understood as illustrative examples of the invention. For example, it is noted again that although the above examples refer specifically to cables 4, 10, 30a-38c, 430a-430c, this need not necessarily be the case that in other examples any electrical energy distribution element 4, 10, 30a-38c, 430a-430c such as a busbar or a cable or any other element that distributes electrical energy, for example by transporting electrons, may be used. As another example, it is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the invention, which is defined in the accompanying claims.

The invention claimed is:

1. An apparatus configured to detect a current imbalance between two or more electrical energy distribution elements of an electrical energy distribution network in use, the apparatus comprising:
 a plurality of temperature sensors, each of the temperature sensors implemented by a temperature sensing section of an optical fiber, and each of the temperature sensing sections arranged to produce, in response to an optical input signal, an optical output signal indicative of a temperature of the temperature sensing section,
 one or more first temperature sensors of the plurality of temperature sensors are configured for thermal contact with a first electrical energy distribution element of the electrical energy distribution network;
 one or more second temperature sensors of the plurality of temperature sensors are configured for thermal contact with a second, different, electrical energy distribution element of the electrical energy distribution network; and
 a detecting unit configured to:

determine a first temperature characteristic of the first electrical energy distribution element based on one or more of the optical output signals of the one or more first temperature sensors;

determine a second temperature characteristic of the second electrical energy distribution element based on one or more of the optical output signals of the one or more second temperature sensors;

compare the first temperature characteristic with the second temperature characteristic; and detect a current imbalance between the first electrical energy distribution element and the second electrical energy distribution element based on the comparison of the first temperature characteristic with the second temperature characteristic.

2. The apparats according to claim 1, wherein the detecting unit is configured to detect the current imbalance based on a determination that a difference between the first temperature characteristic and the second temperature characteristics is greater than a threshold value.

3. The apparatus according to claim 1, wherein the detecting unit is configured to infer, based on the first temperature characteristic and the second characteristic, which of the electrical energy distribution elements is associated with a fault causing the detected current imbalance.

4. The apparatus according to claim 1, wherein the apparatus further comprises:

a plurality of optical fibers, wherein the one or more of the first temperature sensors are implemented by said temperature sensing sections of a first optical fiber of the plurality of optical fibers, and the one or more second temperature sensors are implemented by said temperature sensing sections of a second, different, optical fiber of the plurality of optical fibers.

5. The apparatus according to claim 1, wherein a plurality of the first temperature sensors are configured for thermal contact at respective different points along a length of the first electrical energy distribution element, and wherein a plurality of the second temperature sensors are configured for thermal contact at respective different points along a length of the second electrical energy distribution element.

6. The apparatus according to claim 1, wherein the detecting unit comprises:

an optical interrogator configured to provide the optical input signal to each of the temperature sensing sections, and receive the optical output signal from each of the temperature sensing sections.

7. The apparatus according to claim 1, further comprising a third electrical energy distribution element of the electrical energy distribution network, wherein a third temperature sensor of the plurality of temperature sensors is configured for thermal contact with the third electrical energy distribution element, and wherein the detecting unit is configured to:

determine a third temperature characteristic of the third electrical energy distribution element based on one or more of the optical output signals of the third temperature sensor; and detect a current imbalance between the third electrical energy element and at least one of the first electrical energy distribution element and the second electrical energy distribution element, based on a comparison of the third temperature characteristic with at least one of the first temperature characteristic and the second temperature characteristic.

8. The apparatus according to claim 1, wherein the detecting unit is configured to, in response to detecting the current imbalance, trigger a mitigation action for the current imbalance.

9. A system comprising the apparatus according to claim 1, and the electrical energy distribution network.

10. The system according to claim 9, wherein the electrical energy distribution network is configured such that a given current carried by the electrical energy distribution network between an electrical energy source and an electrical energy consumer is shared across the first electrical energy distribution element and the second energy distribution element.

11. The system according to claim 10, wherein each of the first electrical energy distribution element and the second energy distribution element are cables provided together as a bundled cable.

12. The system according to claim 11, wherein the optical fiber or optical fiber by which the temperature sensing sections are provided are embedded in the bundled cable.

13. The system according to claim 10, wherein the electrical energy distribution network comprises a electrical energy source, and the detecting unit is configured to respond to the detection of the current imbalance by transmitting a control signal to the electrical energy source to reduce a current carried by the electrical energy distribution elements; or the electrical energy distribution network comprises a fuse common to each of the first electrical energy distribution element and the second energy distribution element, and the detecting unit is configured to respond to the detection of the current imbalance by transmitting a control signal to the fuse to cause the fuse to break an electrical connection provided by each of the first electrical energy distribution element and the second energy distribution element.

14. The system according to claim 9, wherein the electrical energy distribution network is configured such that the first electrical energy distribution element and the second energy distribution element carry alternating current of the same phase between an electrical energy source and an electrical energy consumer.

15. The system according to claim 9, wherein the electrical energy distribution network is configured such that each of the first electrical energy distribution element and the second energy distribution element carries alternating current of a respective different phase from a multiphase electrical energy source to a multiphase electrical energy consumer.

16. The system according to claim 15, wherein the detecting unit is configured to respond to the detection of the current imbalance by transmitting a control signal to the multiphase electrical energy source to alter an operating condition of the multiphase electrical energy power source.

17. The system according to claim 9, wherein the first electrical energy distribution element and the second energy distribution element are configured to carry alternating current of a first phase from a multiphase source to a multiphase consumer, and the system further comprises a third electrical energy distribution element configured to carry alternating current of a second, different, phase from the multiphase source to the multiphase consumer, and wherein the detecting unit is configured to:

determine a third temperature characteristic of the third electrical energy distribution element based on one or more of the optical output signals of the third temperature sensor; and based on a comparison of the third temperature characteristic with at least one of the first temperature characteristic and the second temperature characteristic, detect a second current imbalance between the first phase and the second phase.

18. The system according to claim 9, wherein the detecting unit is configured to:

respond to a determination that at least one of the first temperature characteristic, the second temperature characteristic and the third temperature characteristic is higher than a given temperature limit, transmit a control signal to a fuse associated with a corresponding one or more of the first electrical energy distribution element, the second electrical energy distribution element and the third electrical energy distribution element to cause the fuse to break the electrical connection provided by the given electrical energy distribution element.

19. The system according to claim 9, wherein the electrical energy distribution network is a vehicle's electrical energy distribution network.

20. The system according to claim 19, wherein an electrical energy consumer to which the electrical energy distribution network is configured to provide electrical energy is a vehicle electrical propulsion motor.

21. A vehicle comprising the apparatus according to claim 1.

22. The vehicle according to claim 21, wherein the vehicle is an aircraft.

23. The vehicle according to claim 22, wherein the plurality of temperature sensors are located in a wing portion of the aircraft.

24. The vehicle according to claim 23, wherein the plurality of temperature sensors are located in a pylon of the wing portion.

25. A method of detecting current imbalance between two or more electrical energy distribution elements of an electrical energy distribution network, the method comprising:

sending an optical input signal to each of a plurality of temperature sensors, each of the temperature sensors include a temperature sensing section of an optical fiber, and each of the temperature sensing sections is arranged to produce, in response to an optical input signal, an optical output signal indicative of a temperature of the temperature sensing section, wherein one or more first temperature sensors of the plurality of temperature sensors are in thermal contact with a first electrical energy distribution element of the electrical energy distribution network; and one or more second temperature sensors of the plurality of temperature sensors are in thermal contact with a second, different, electrical energy distribution element of the electrical energy distribution network;

determining a first temperature characteristic of the first electrical energy distribution element based on one or more of the optical output signals of the one or more first temperature sensors;

determining a second temperature characteristic of the second electrical energy distribution element based on one or more of the optical output signals of the one or more second temperature sensors;

comparing the first temperature characteristic with the second temperature characteristic; and detecting a current imbalance between the first electrical energy distribution element and the second electrical energy distribution element based on the comparison of the first temperature characteristic with the second temperature characteristic.

* * * * *